United States Patent [19]
Shim et al.

[11] Patent Number: 5,850,146
[45] Date of Patent: Dec. 15, 1998

[54] PROBE APPARATUS FOR ELECTRICAL INSPECTION OF PRINTED CIRCUIT BOARD ASSEMBLY

[75] Inventors: Jae-hong Shim; Hyung-suck Cho, both of Seoul; Do-young Kam, Suwon, all of Rep. of Korea

[73] Assignee: Samsung Electronics Co., Ltd., Kyungki-Do, Rep. of Korea

[21] Appl. No.: 680,693

[22] Filed: Jul. 18, 1996

[30] Foreign Application Priority Data

Dec. 30, 1995 [KR] Rep. of Korea ................ 1995 69755

[51] Int. Cl.$^6$ .................................................. G01R 31/02
[52] U.S. Cl. ........................................... 324/761; 324/758
[58] Field of Search .................................. 324/754, 761, 324/72.5, 757, 758, 715

[56] References Cited

U.S. PATENT DOCUMENTS

| | | | |
|---|---|---|---|
| 3,609,539 | 9/1971 | Gunthert | 324/72.5 |
| 4,267,507 | 5/1981 | Guerpont | 324/754 |
| 4,956,923 | 9/1990 | Pettingell et al. | 33/558 |
| 5,107,206 | 4/1992 | Yanagi et al. | 324/754 |
| 5,469,064 | 11/1995 | Kerschner et al. | 324/537 |

*Primary Examiner*—Ernest F. Karlsen
*Assistant Examiner*—Russell M. Kobert
*Attorney, Agent, or Firm*—Sughrue, Mion, Zinn, Macpeak & Seas, PLLC

[57] ABSTRACT

A probe apparatus for the electrical inspection of a printed circuit board (PCB) assembly includes a probe assembly for inspecting the electrical circuitry of a PCB having electronic components mounted thereon. A first driving mechanism is provided for moving the probe assembly rectilinearly, and a guide is provided for guiding the rectilinear movement of the probe assembly. The probe assembly includes a probe tip for making contact with a solder joint on the PCB to detect a signal for the electrical inspection, a force sensor combined with the rear portion of the probe tip for measuring a contact force applied to the probe tip when the probe tip makes contact with the solder joint, a location sensor for measuring the location of the probe tip when in contact with the solder joint, and a device for controlling the location of the probe tip, according to the measured contact force and location thereof. The probe may further include a second driving mechanism for controlling the angle of inclination of the probe assembly to solder joints. Such a probe is improved in adaptability to the various patterns of the solder joints and thus enables stable testing of the PCB, by preventing poor soldering as well as vibration of the probe tips.

7 Claims, 3 Drawing Sheets

PROBE APPARATUS FOR ELECTRICAL INSPECTION OF PRINTED CIRCUIT BOARD ASSEMBLY

BACKGROUND OF THE INVENTION

The present invention relates to a probe apparatus for the electrical inspection of a printed circuit board (PCB) assembly and, more particularly, to a probe apparatus improved to inspect effectively the electrical circuitry of a printed circuit board loaded with electronic components.

In the course of PCB assembly, a printed circuit board is loaded with electronic components and then undergoes an inspection process for determining the status of the assembly. In such an electrical circuitry inspection process, defects in assembly or in the electronic components themselves, and poor (cold) solder joints are inspected by continuity checks of the installed electronic components.

FIG. 1 shows a conventional probe apparatus for the electrical inspection of a PCB assembly. The apparatus comprises a driving motor, e.g., a DC servo motor, a timing belt 120 looped around a pulley 110 on the drive shaft of the motor, a pair of probe assemblies 130, 130' coupled to the ends of the timing belt 120, respectively, and a pair of guides 140, 140' for guiding the probe assemblies 130, 130'. The probe assemblies 130, 130' comprise a pair of probe blocks 131, 131' combined with the ends of the timing belt 120, respectively, a pair of probe tips 132, 132' combined with the ends of the probe blocks 131, 131', respectively, and a pair of springs 133, 133' respectively installed between the probe blocks 131, 131' and probe tips 132, 132'.

As the timing belt 120 is combined with the pulley 110 of the motor in a "U" shape, the probe assemblies 130, 130' operate by way of an up-and-down movement in opposing directions according to the driving action of the motor. For example, when the right probe assembly descends to make contact with a solder joint of the printed circuit board, the left probe assembly ascends in a counteraction. To guide such up-and-down movements of the probe assemblies 130, 130', the guides 140, 140' and probe blocks 131, 131' may be, for example, in the form of a rail structure.

In FIG. 1, reference numeral 100 denotes an adapter for combining the probe apparatus to a robot (not shown), to which the motor is joined.

FIG. 2 is a schematic drawing showing the inspection of the electrical circuitry of a printed circuit board 150, using such a conventional probe apparatus.

In FIG. 2, to inspect the electrical circuitry, the probe assemblies 130, 130' as shown in FIG. 1 are necessary. The reference numerals 132, 132' and 133, 133' denote probe tips and springs, respectively, corresponding to those of FIG. 1.

During the PCB testing, when the probe tips 132 and 132' of the probe assemblies 130 and 130' make contact with the solder joints 152, which combine an electronic component 151 with the printed circuit board 150, the probe tips 132 and 132' receive a contact force which is then absorbed by the springs 133 and 133', respectively.

In the conventional probe apparatus, however, it is impossible to control the angles of inclination of the probe tips 132 and 132' to the solder joints 152 because the probe assemblies 130 and 130' move in only up-and-down directions. Therefore, the conventional probe apparatus is ineffective due to its lack of adaptability to the various patterns of the solder joints 152.

In addition, plastic deformation of the solder joints 152 due to the contact with the probe tips 132 and 132', resulting from insufficient absorption of the contact force by the springs 133 and 133', can degrade the solder connection. Moreover, vibration of the springs 133 and 133' transmitted to the probe tips 132 and 132', caused by the contact of the probe tips with the solder joints 152, can cause a distortion of an electrical signal.

SUMMARY OF THE INVENTION

It is an object of the present invention to provide a probe apparatus for the electrical inspection of a PCB assembly, in which the control of the angle of inclination of the probe tip with respect to solder joint is enabled.

To achieve the object, there is provided a probe apparatus for the electrical inspection of a PCB assembly which includes a printed circuit board having electronic components mounted thereon and defining electrical circuitry, comprising a probe assembly for inspecting the electrical circuitry of the printed circuit board having the electronic components mounted thereon, first driving means for moving the probe assembly rectilinearly, a guide for guiding the rectilinear movement of the probe assembly, and second driving means for controlling the angle of inclination of the probe assembly with respect to a solder joint on the printed circuit board.

It is another object of the present invention to provide a probe apparatus for the electrical inspection of a PCB assembly, wherein the generation of poor solder connections is prevented by reducing the contact force generated from the contact of the probe tip with the solder joint.

It is still another object of the present invention to provide a probe apparatus for the electrical inspection of a PCB assembly, wherein the generation of distortion of the electrical signal caused by vibration of the probe tip is prevented.

To achieve the objects, there is provided a probe apparatus for the electrical inspection of a PCB assembly which includes a printed circuit board having electronic components mounted thereon and defining electrical circuitry, comprising a probe assembly for inspecting the electrical circuitry of the printed circuit board having the electronic components mounted thereon, first driving means for moving the probe assembly rectilinearly, and a guide for guiding the rectilinear movement of the probe assembly, wherein the probe assembly comprises a probe tip for making contact with a solder joint of a corresponding one of the electronic components mounted on the printed circuit board to detect a signal for the electrical inspection, said probe tip defining a rear portion, a force sensor, combined with the rear portion of the probe tip, for measuring a contact force applied to the probe tip when the probe tip makes contact with the solder joint, a location sensor for measuring a location of the probe tip when in contact with the solder joint, and means for controlling the location of the probe tip, according to the measured contact force and location thereof.

In this case, the location controlling means comprises a light source fixed at a predetermined location for emitting a laser beam along a path, a moving mirror movably installed along the path of the laser beam for reflecting the laser beam to the location sensor, and a moving coil for moving the moving mirror along the path of the laser beam by moving according to an electric current controllably applied in response to the measured contact force and location of the probe tip.

BRIEF DESCRIPTION OF THE DRAWINGS

The above objects and advantages of the present invention will become more apparent by describing in detail a preferred embodiment thereof with reference to the accompanying drawings, in which.

DETAILED DESCRIPTION OF THE INVENTION

Figure 1:
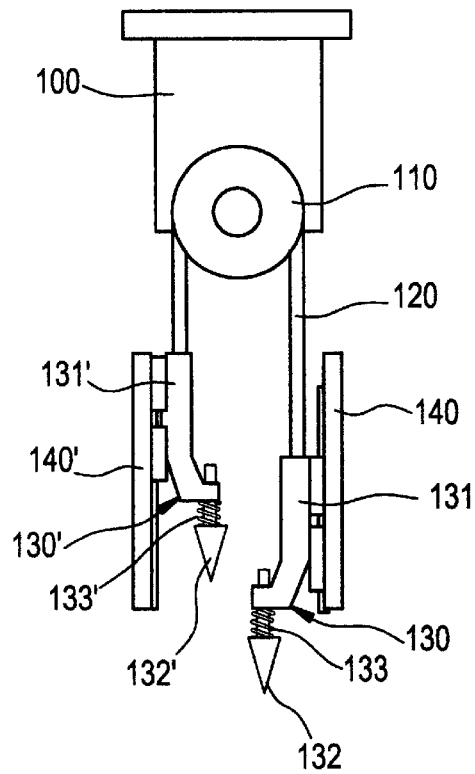
FIG. 1 is a schematic view of a conventional probe apparatus for the electrical inspection of a PCB assembly.
Figure 2:
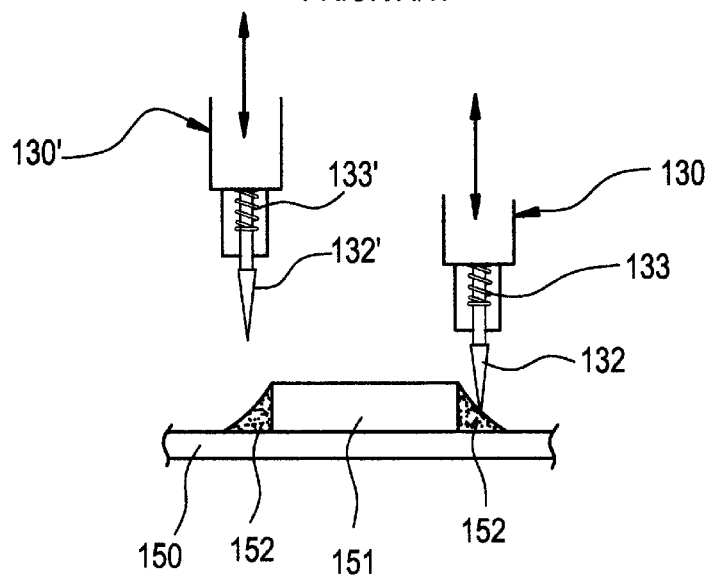
FIG. 2 is an explanatory schematic drawing showing the inspection process of a printed circuit board during assembly.
Figure 3:
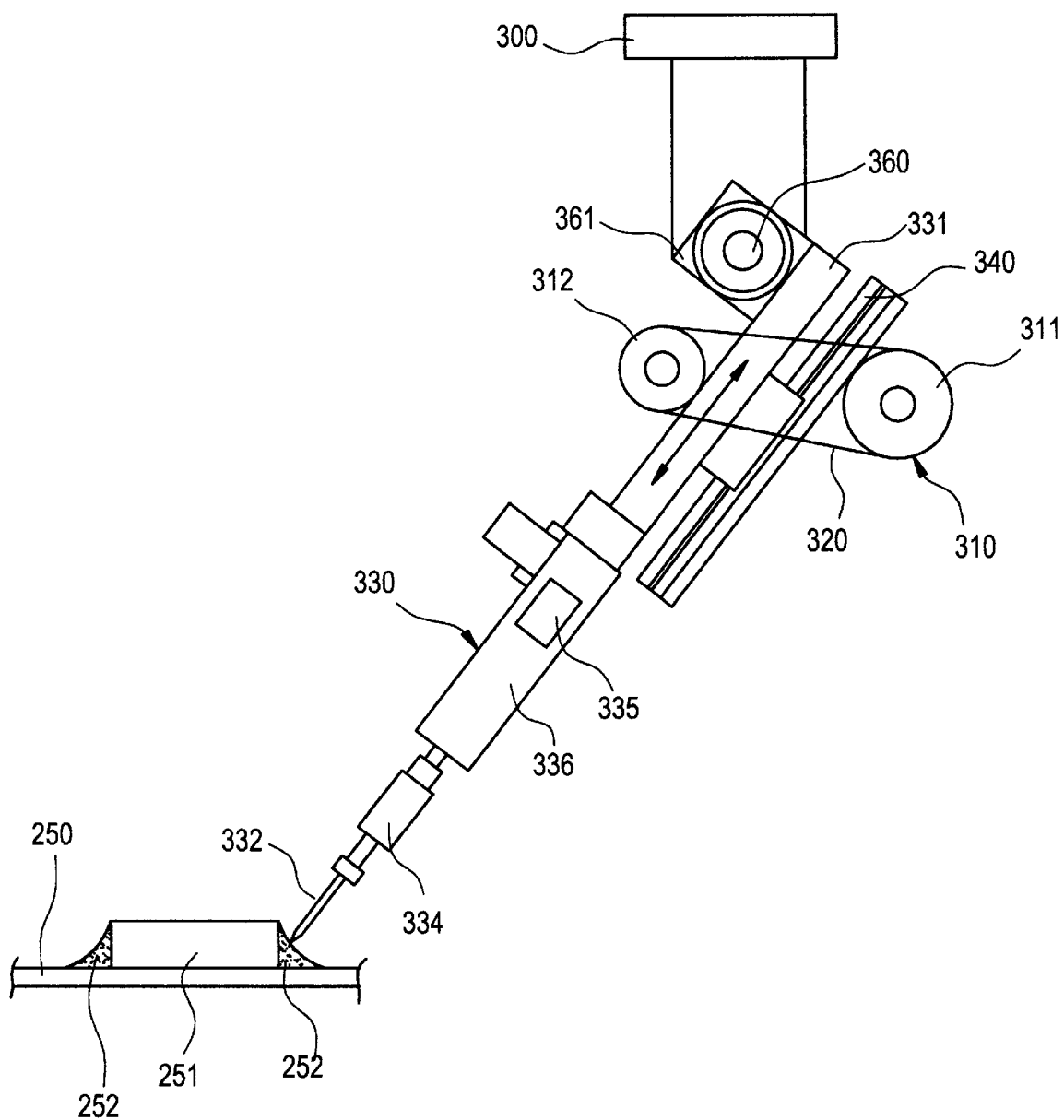
FIG. 3 is a schematic view of a probe apparatus for the electrical inspection of a PCB assembly, according to an embodiment of the present invention.
Figure 4:
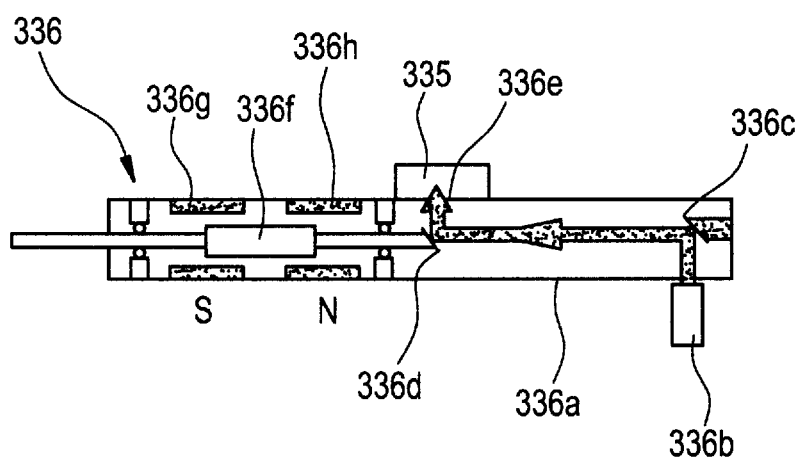
FIG. 4 is a detailed view showing the location controlling portion of the apparatus in FIG. 3.

Referring to FIGS. 3 and 4, the probe apparatus for the electrical inspection of a PCB assembly according to the present invention comprises a probe assembly 330 for inspecting the electrical circuitry by making contact with the electronic component 251 mounted on the printed circuit board 250 by the solder joints 252; a first driving motor 310 for moving the probe assembly 330 in a rectilinear direction with respect to the solder joint 252; a guide 340 for guiding the rectilinear movement of the probe assembly 330; and a second driving motor 360 for controlling the angle of inclination of the probe assembly 330 with respect to the solder joint 252.

In this case, the first and second driving motors 310 and 360 are preferably composed of DC servo motors.

The probe assembly 330 comprises a probe tip 332 for detecting an electrical signal for the electrical inspection by making contact with the solder joint 252; a force sensor 334 combined with the rear portion of the probe tip 332 for measuring a contact force applied to the probe tip 332 when the probe tip makes contact with the solder joint; a location sensor 335 for measuring the location of the probe tip 332 at the time when the probe tip 332 makes contact with the solder joint 252; a location controlling portion 336 for controlling the location of the probe tip 332 according to the contact force and location measured by the force sensor 334 and location sensor 335, respectively; and a probe block 331 for supporting the rectilinear movement of the probe assembly 330, coupled with the guide 340 which, for example, is in the form of a rail structure.

The location controlling portion 336 comprises, as shown in FIG. 4, a cylindrical body 336a; a light source 336b, preferably a laser diode fixed to the outside of the right end of the body 336a for emitting a laser beam inside the body 336a; a fixed mirror 336c fixed to the inner right end of the body 336a for reflecting the laser beam emitted from the light source 336b along the body 336a in the longitudinal direction of the body 336a; a moving mirror 336d installed inside of the body 336a to be movable along the body 336a for reflecting the laser beam reflected from the fixed mirror 336c to a hole 336e formed in the middle of the body 336a; and a moving coil 336f moving according to an electric current from a controller (not shown), in response to the contact force and location of the probe tip 332 measured by the force and location sensors 334 and 335, combined with the moving mirror 336d. In FIG. 4, reference numerals 336g and 336h denote magnets for electromagnetic interaction with the moving coil 336f.

Referring to FIG. 4, the location sensor 335, being installed near the hole 336e of the body 336a of the location controlling portion 336, measures an initial location of the probe tip 332 according to the location of the laser beam emitted through the hole 336e of the body 336a. Thus, it is possible to measure the initial location of the probe tip 332 from the change of the location of the laser beam, since the location of the moving mirror 336d changes according to the contact location of the probe tip 332 when the probe tip 332 initially makes contact with the solder joint and thus the location of the laser beam reflected from the moving mirror 336d changes.

The force sensor 334 can be composed of, for example, a pressure sensor, and measures the force applied to the probe tip 332 when it makes initial contact with the solder joint, namely, the contact force mentioned above. This initial contact force and location of the probe tip 332 measured as indicated above are compared with a standard contact force and location, respectively, and the electric current determining the movement amount of the moving mirror 336d is applied to the moving coil 336f according to the result of the comparison. Such operations are performed by the controller.

Since the location of the probe tip 332 making contact with the solder joint can be controlled by the location controlling portion 336, the electrical inspection of the printed circuit board can be performed stably, without vibration of the probe tip 332 and without putting excessive pressure on the solder joint.

To convert the rotation of the first driving motor 310 into the rectilinear motion of the probe assembly 330, a driving pulley 311 combined with the drive shaft (not shown) of the first driving motor 310, a driven pulley 312 combined with the probe block 331 of the probe assembly 330 at a predetermined interval from the driving pulley 311, and a timing belt 320 connecting the pulleys 311 and 312 are employed, as shown in FIG. 3. As shown, the first driving motor 310 and the driving pulley 311 are preferably installed on the bottom of the guide 340.

In the driven pulley 312, for example, a pinion can be installed and a rack can be installed at a corresponding location of the probe block 331. Gearing of the rack and pinion can convert the rotational motion of the first driving motor 310 into the rectilinear motion of the probe assembly 330.

Using, for example, a geared motor as the first driving motor 310 instead of the pulley and combining the drive shaft of the geared motor with the pinion can simplify the structure.

Another feature of the present invention, namely, the second driving motor 360 for controlling the angle of inclination of the probe assembly 330 to the solder joint is combined with one end of the probe block 331 of the probe assembly 330. As shown in FIG. 3, a motor block 361 is provided as a means for combining the probe block 331 with the second driving motor 360. Namely, the motor block 361 is combined with the drive shaft (not shown) of the second driving motor 360 and the probe block 331 is combined with the motor block 361, for example, in a bolt structure. The second driving motor 360 is combined with an adapter 300 installed in a robot (not shown). The adapter 300 moves interlockingly with the rectilinear movement of the probe assembly 330.

Feasible control of the angle of inclination of the probe assembly 330 to the solder joint by the second driving motor 360 leads to easy adaptation to the various patterns of the solder joint.

As described above, the present invention provides a probe apparatus for the electrical inspection of a PCB assembly, whose adaptability is improved for the various patterns of the solder connections of a printed circuit board, thus enabling the stable inspection of its electrical circuitry by preventing poor soldering and the vibration of the probe tips.

It is contemplated that numerous modifications may be made to the probe apparatus of the present invention without departing from the spirit and scope of the invention as defined in the following claims.

What is claimed is:

1. A probe apparatus for electrical inspection of a printed circuit board (PCB) assembly which includes a printed circuit board having electronic components mounted thereon and defining electrical circuitry, said probe apparatus comprising:

a probe assembly including a probe tip for inspecting the electrical circuitry of the printed circuit board having the electronic components mounted thereon, said probe assembly normally being disposed at an inclined angle position with respect to the printed circuit board;

means for moving said probe assembly rectilinearly toward and away from the printed circuit board along the inclined angle position;

a guide for guiding the rectilinear movement of said probe assembly toward and away from the printed circuit board along the inclined angle position; and means for controlling the inclined angle position of the probe assembly with respect to a solder joint on the printed circuit board, said inclined angle position controlling means being operative to rotate said probe assembly and in turn said probe tip.

2. The probe apparatus for electrical inspection of a PCB assembly as claimed in claim 1, wherein said probe assembly comprises:

a probe tip for making contact with a solder joint of a corresponding one of the electronic components mounted on the printed circuit board to detect a signal for the electrical inspection, said probe tip defining a rear portion;

a force sensor, combined with the rear portion of the probe tip, for measuring a contact force applied to said probe tip when said probe tip makes contact with the solder joint;

a location sensor for measuring a location of said probe tip when in contact with the solder joint; and, means for controlling the location of said probe tip, according to the measured contact force and location thereof.

3. The probe apparatus for electrical inspection of a PCB assembly as claimed in claim 2, wherein the location controlling means comprises:

a light source fixed at a predetermined location for emitting a laser beam along a path;

a moving mirror movably installed along the path of the laser beam for reflecting the laser beam to said location sensor; and a moving coil for moving said moving mirror along the path of the laser beam by moving according to an electric current controllably applied in response to the measured contact force and location of the probe tip.

4. The probe apparatus for electrical inspection of a PCB assembly as claimed in claim 3, wherein said location controlling means further comprises:

a body inside of which said moving mirror and moving coil are installed; and a fixed mirror installed on the path of the laser beam between said light source and said moving mirror for reflecting the laser beam to said moving mirror, wherein said location sensor is located near said body, said body being formed with a hole to transmit the laser beam reflected from the moving mirror to the location sensor.

5. A probe apparatus for electrical inspection of a printed circuit board (PCB) assembly which includes a printed circuit board having electronic components mounted thereon and defining electrical circuitry, said probe apparatus comprising:

a probe assembly including a probe tip for inspecting the electrical circuitry of the printed circuit board having the electronic components mounted thereon, said probe assembly normally being disposed at an inclined angle position with respect to the printed circuit board;

a first driving mechanism which moves said probe assembly rectilinearly toward and away from the printed circuit board along the inclined angle position;

a guide for guiding the rectilinear movement of said probe assembly toward and away from the printed circuit board along the inclined angle position; and a second driving mechanism which controls the inclined angle position of the probe assembly with respect to a solder joint on the printed circuit board, said second driving mechanism being operative to rotate said probe assembly and in turn said probe tip.

6. The probe apparatus for electrical inspection of a PCB assembly as claimed in claim 5, wherein said probe assembly includes a probe block, and wherein said first driving mechanism includes a first driving motor and a rotational-to-rectilinear motion conversion mechanism disposed between said first driving motor and said probe block, thereby to convert rotation of the first driving motor into the rectilinear movement of said probe assembly toward and away from the printed circuit board.

7. The probe apparatus for electrical inspection of a PCB assembly as claimed in claim 6, wherein said second driving mechanism includes a motor block combined with said probe block, and a second driving motor having a drive shaft, said motor block being combined with said drive shaft, thereby to rotate said probe assembly and thus control the inclined angle position of said probe assembly.

* * * * *